United States Patent [19]
Matsui

[11] Patent Number: 5,535,163
[45] Date of Patent: Jul. 9, 1996

[54] SEMICONDUCTOR MEMORY DEVICE FOR INPUTTING AND OUTPUTTING DATA IN A UNIT OF BITS

[75] Inventor: Yoshinori Matsui, Tokyo, Japan

[73] Assignee: NEC Corporation, Tokyo, Japan

[21] Appl. No.: 332,727

[22] Filed: Nov. 1, 1994

[30] Foreign Application Priority Data

Nov. 1, 1993 [JP] Japan .................................... 5-273684

[51] Int. Cl.⁶ ............................ G11C 11/34; H01L 27/10
[52] U.S. Cl. .................. 365/201; 365/189.03; 371/21.1; 371/21.3; 371/27
[58] Field of Search ..................................... 365/200, 201, 365/189.01, 189.03; 371/10.1, 10.2, 21.1, 21.3, 27

[56] References Cited

U.S. PATENT DOCUMENTS

5,072,138  12/1991  Slemmer et al. ..................... 307/465
5,138,619  8/1992  Fasang et al. .

FOREIGN PATENT DOCUMENTS

0446449  9/1991  European Pat. Off. .
63-127500  5/1988  Japan .
63-191400  8/1988  Japan .
1-140489  6/1989  Japan .

*Primary Examiner*—Viet Q. Nguyen
*Attorney, Agent, or Firm*—Popham, Haik, Schnobrich & Kaufman, Ltd.

[57] ABSTRACT

A multibit semiconductor memory device for inputting and outputting data in a parallel fashion in a unit of bits. The multibit memory has a memory cell array composed of mixed memory cells corresponding to different IO bits, data I/O terminals corresponding respectively to IO bits, an address terminal for inputting an address and internal data buses associated respectively with the IO bits and connected to the memory cell array. Further, the memory device has a test mode entry signal generator for generating a test mode entry signal indicative of entry into a test mode, a pseudo-address generator connected to the address terminal, for generating a pseudo-address in the test mode, and a connecting circuit responsive to the test mode entry signal for selecting one of the internal data buses depending on the pseudo-address and connecting the selected bus to predetermined one of the data I/O terminals.

7 Claims, 5 Drawing Sheets

SEMICONDUCTOR MEMORY DEVICE FOR INPUTTING AND OUTPUTTING DATA IN A UNIT OF BITS

BACKGROUND OF THE INVENTION

1. Field of the Invention

The present invention relates to a semiconductor memory device, and more particularly to a multibit memory for inputting and outputting data in a unit of bits.

2. Description of the Related Art

Semiconductor memory devices have a memory cell array from which a memory cell can be selected by designating a row address and a column address. Unless specially designed otherwise, data are inputted to and outputted from the memory cell array bit by bit. In a CPU to which such a semiconductor memory device is connected, one word is composed of plural bits, e.g., 16 bits or 32 bits, and data are inputted to and outputted from the CPU word by word. Since using as many semiconductor memory devices as the number of bits on a data bus connected to a CPU is limited by cost and package area considerations, there have widely been developed semiconductor memory devices capable of inputting and outputting data in a unit of simultaneous parallel bits.

A semiconductor memory device for inputting and outputting data in a unit of bits will hereinafter be referred to as a "multibit memory", and a bit serving as a unit for inputting and outputting data will hereinafter be referred to as an "IO bit". A multibit memory has as many data input/output terminals as the number of IO bits, and each data input/output terminal is used to input and output 1-bit data. Data are written in and read from a multibit memory in a parallel fashion through the data input/output terminals. Typically, the number of the IO bits is 4, 8 or 16.

Generally, a memory cell array of a multibit memory may be divided per IO bit, or may be arranged to correspond to a plurality of different IO bits. In former memory cell array configuration, the number of IO bits is limited by the number of divisions of the word length of the memory cell array. For example, if the word length is divided into four sections, then the memory cell array is divided into four memory cell arrays, and these four memory cell arrays can be accessed simultaneously. When different IO bits are assigned respectively to the four memory cell arrays, the memory cell arrays jointly make up a memory whose IO bits are four bits. The number of divisions of the word length is generally determined in view of the time constant of word lines. If a word length is divided into halves, then the number of memory cells connected to a word line is reduced to one-half, and the length of the line is reduced to one-half, with the result that the time constant becomes one-quarter. Therefore, the number of divisions of a word line is determined so that the time constant thereof will satisfy the access speed for a target word line.

If a word length is divided into quarters, then a memory cell array is divided into four memory cell arrays, making it possible to construct a memory of IO bits up to four bits. However, it is impossible to construct a memory having more IO bits without mixing different IO bits in the same memory cell array. Stated otherwise, in order to construct a memory having eight IO bits, it is necessary to distribute two IO bits, i.e., two data input/output terminals, to each memory cell array.

FIG. 1 shows in block form a conventional multibit dynamic memory, the view primarily illustrating an input/output circuit thereof. For the sake of brevity, the memory circuit has two IO bits. One memory cell array 100 has memory cells $MC_{11}$ to $MC_{14}$, $MC_{21}$ to $MC_{24}$ each belonging to a different IO bit (input/output signal terminals $IO_1$, $IO_2$).

The input/output signal terminals $IO_1$, $IO_2$ are data terminals which will be used to input and output data to and from the memory cells. The input/output signal terminals $IO_1$, $IO_2$ are connected to input buffers $DIN_1$, $DIN_2$, respectively, and output buffers $DOUT_1$, $DOUT_2$, respectively. The memory has data buses $RWBS_1$, $RWBS_2$. The data bus $RWBS_1$ is connected through buffers 91, 93 respectively to the input buffer $DIN_1$ and the output buffer $DOUT_1$, and the data bus $RWBS_2$ is connected through buffers 92, 94 respectively to the input buffer $DIN_2$ and the output buffer $DOUT_2$. To the data buses $RWBS_1$, $RWBS_2$, there are connected respective write data amplifiers $WBUF_1$, $WBUF_2$ and respective read data amplifiers $DAMP_1$, $DAMP_2$.

The memory has input/output data line pairs $IOT_1/ION_1$, $IOT_2/ION_2$ near the memory cell array. The input/output data line pairs $IOT_1/ION_1$ are connected to both of the write data amplifier $WBUF_1$ and the read data amplifiers $DAMP_1$, and the input/output data line pairs $IOT_2/ION_2$ are connected to both of the write data amplifier $WBUF_2$ and the read data amplifiers $DAMP_2$.

The memory cell array 100 has word lines $WL_1$, $WL_2$, . . . and digit line pairs $DL_1/\overline{DL_1}$, $DL_2/\overline{DL_2}$, $DL_3/\overline{DL_3}$, . . . which extend perpendicularly to each other. Memory cells $MC_{11}$, $MC_{12}$, $MC_{13}$, $MC_{14}$, $MC_{21}$, $MC_{22}$, . . . positioned at the respective points of intersection between the word lines and the digit line pairs. Sense amplifiers $S_1$, $S_2$, $S_3$, $S_4$, . . . including column switches are provided at ends of the respective digit line pairs $DL_1/\overline{DL_1}$, $DL_2/\overline{DL_2}$, $DL_3/\overline{BL_3}$, . . . . The odd-numbered sense amplifiers $S_1$, $S_3$, . . . are connected to the input/output data line pairs $IOT_1/ION_1$, and the even-numbered sense amplifiers $S_2$, $S_4$, . . . are connected to the input/output data line pairs $IOT_2/ION_2$. The sense amplifiers $S_1$, $S_2$, $S_3$, $S_4$, . . . are activated by column switch signals to connect corresponding digit line pairs and input/output data line pairs. Each of the column switch signals corresponds to two sense amplifiers, so that sense amplifiers $S_{2n-1}$, $S_{2n}$ can be controlled by a column switch signal $YSW_n$.

Operation of the multibit memory shown in FIG. 1 will be described below.

In a write operation mode, external signal levels applied to the input/output signal terminals $IO_1$, $IO_2$ are supplied through the input buffers $DIN_1$, $DIN_2$ and the buffers 91, 92 to the data buses $RWBS_1$, $RWBS_2$, respectively. In a read operation mode, data from the data buses $RWBS_1$, $RWBS_2$ are outputted through the buffers 93, 94 and the output buffers $DOUT_1$, $DOUT_2$ to the input/output signal terminals $IO_1$, $IO_2$.

Data are written in and read from the memory cell array 100 through the input/output data line pairs $IOT_1/ION_1$, $IOT_2/ION_2$, the write data amplifiers $WBUF_1$, $WBUF_2$, and the read data amplifiers $DAMP_1$, $DAMP_2$. More specifically, data are written in the memory cell array 100 as follows: Data supplied to the data buses $RWBS_1$, $RWBS_2$ are amplified by the write data amplifiers $WBUF_1$, $WBUF_2$, and then supplied to the input/output data line pairs $IOT_1/ION_1$, $IOT_2/ION_2$, respectively. When either one of the column switch signals $YSW_1$, $YSW_2$, . . . is activated by a column address signal, the corresponding sense amplifier is activated. For example, if the column switch signal $YSW_1$ is selected and activated, then data supplied to the input/output data line pair $IOT_1/ION_1$ are outputted through the sense amplifier $S_1$ to the digit line pair $DL_1/\overline{DL_1}$, and data supplied to the input/output data line pair $IOT_2/ION_2$ are outputted through the sense amplifier $S_2$ to the digit line pair $DL_2/\overline{DL_2}$.

At the same time, either one of the word lines $WL_1$, $WL_2$, is activated by a row address signal, thereby writing the data on the digit lines in the connected memory cells. For example, if the word line $WL_1$ is selected and activated, then the data supplied to the digit line pairs $DL_1/\overline{DL_1}$, $DL_2/\overline{DL_2}$ are written in the respective memory cells $MC_{11}$, $MC_{12}$.

Data stored in the memory cell array 100 are read as follows:

If the word line $WL_1$ is selected and activated, then data stored in the memory cells $MC_{11}$, $MC_{12}$, $MC_{13}$, $MC_{14}$ are supplied respectively to the digit lines $DL_1$, $DL_2$, $DL_3$, $DL_4$ and amplified respectively by the sense amplifiers $S_1$, $S_2$, $S_3$, $S_4$. If, at this time, the column switch signal $YSW_1$ is selected and activated, then data from the digit line pair $DL_1/\overline{DL_1}$ are outputted to the input/output data line pair $IOT_1/ION_1$ through the sense amplifier $S_1$ and data from the digit line pair $DL_2/\overline{DL_2}$ are outputted to the input/output data line pair $IOT_2/ION_2$ through the sense amplifiers $S_2$. These data are then amplified by the read data amplifiers $DAMP_1$, $DAMP_2$ and outputted to the data buses $RWBS_1$, $RWBS_2$.

In the memory shown in FIG. 1, each of the memory cells of the memory cell array 100 corresponds to either one of the first and second input/output signal terminals $IO_1$, $IO_2$. Specifically, data are inputted to and outputted from the memory cells $MC_{11}$, $MC_{13}$, $MC_{21}$, $MC_{23}$, ... only through the first-input/output signal terminal $IO_1$, and data are inputted to and outputted from the memory cells $MC_{12}$, $MC_{14}$, $MC_{22}$, $MC_{24}$, ... only through the second input/output signal terminal $IO_2$. Consequently, data are inputted to and outputted from the memory cells $MC_{11}$, $MC_{12}$, for example, through different paths, and data are inputted to and outputted from the memory cells $MC_{13}$, $MC_{14}$, or $MC_{21}$, $MC_{22}$, or $MC_{23}$, $MC_{24}$ through different paths.

For testing the memory, it is necessary to write data in the memory cells of the memory cell array in various patterns. A process of writing of data for testing the memory will be described below.

First, logic level "0" is to be written in all of the memory cells $MC_{11}$, $MC_{12}$, $MC_{13}$, $MC_{14}$, ... on the word line $WL_1$. It is assumed that the input/output signal terminals $IO_1$, $IO_2$ and the data buses $RWBS_1$, $RWBS_2$ are of positive logic through the input buffers $DIN_1$, $DIN_2$ and the buffers 91, 92, the data buses $RWBS_1$, $RWBS_2$ and the input/output data lines $IOT_1$, $IOT_2$ are of positive logic through the write data amplifiers $WBUF_1$, $WBUF_2$, the data buses $RWBS_1$, $RWBS_2$ and the input/output data lines $ION_1$, $ION_2$ are of negative logic through the write data amplifiers $WBUF_1$, $WBUF_2$, and the input/output data line pairs and the digit line pairs are of positive logic through the sense amplifier. When logic level "0" is given to the input/output signal terminals $IO_1$, $IO_2$, therefore, the data buses $RWBS_1$, $RWBS_2$ are set to logic level "0", the input/output data lines $IOT_1$, $IOT_2$ to logic level "0", the input/output data lines $ION_1$, $ION_2$ to logic level "1", the digit lines $DL_1$, $DL_2$ to logic level "0", and the digit lines $\overline{DL_1}$, $\overline{DL_2}$ to logic level "1". Accordingly, logic level "0" on the digit lines $DL_1$, $DL_2$ is given to the memory cells $MC_{11}$, $MC_{12}$. In order to write logic level "0" in all the memory cells on the word line $WL_1$, logic level "0" may be given to both the input/output signal terminals $IO_1$, $IO_2$, an address corresponding to the word line $WL_1$ may be given to a row address signal, and a column address signal may successively be changed.

Then, data which are of reversed logic levels in adjacent memory cells are to be written in the memory cells on the word line $WL_1$. Those memory cells which are adjacent to each other on the word line $WL_1$ are memory cells belonging to different IO bits (input/output signal terminals $IO_1$, $IO_2$). Therefore, in order to write data which are of different logic levels in adjacent memory cells, logic levels "0", "1" or "1", "0" are given to the respective input/output signal terminals $IO_1$, $IO_2$, and column addresses are successively changed.

A data pattern of "0", "1", "1", "0" is to be written in the memory cells on a word line, i.e., data of logic level "0", logic level "1", logic level "1", and logic level "0" are to be written respectively in the memory cells $MC_{11}$, $MC_{12}$, $MC_{13}$, $MC_{14}$. In order to write logic levels "0", "1" respectively in the memory cells $MC_{11}$, $MC_{12}$, an address corresponding to the word line $WL_1$ is given to a row address signal, an address for selecting and activating the column switch signal $YSW_1$ is given to a column address signal, and logic levels "0", "1" are given to the respective input/output signal terminals $IO_1$, $IO_2$. Then, in order to write logic levels "1", "0" respectively in the memory cells $MC_{13}$, $MC_{14}$, an address corresponding to the word line $WL_1$ is given to the row address signal, an address for selecting and activating the column switch signal $YSW_2$ is given to the column address signal, and logic levels "1", "0" are given to the respective input/output signal terminals $IO_1$, $IO_2$. At this time, it is necessary to vary, with a column address of the memory cell which is to be accessed, a combination of logic levels to be given to the input/output signal terminals $IO_1$, $IO_2$.

Writing data patterns in the memory cells on a word line has been described. Dynamic memories must be tested using such various data patterns, and a requirement is that they can be checked easily by such a test.

Japanese patent Laid-Open No. 191400/1988 (JP, A 63-191400) discloses a multibit memory which can be tested using only one data input/output signal terminal by degenerating the contents of a function-test from a plurality of memory cells to one signal. The disclosed multibit memory is effective to reduce the number of comparators that are required to test the multibit memory.

A dynamic memory in which memory cells corresponding to different IO bits are mixed in one memory cell array needs to take into account the relationship between the logic addresses of memory cells and physical positions thereof (hereinafter referred to as "physical addresses") and also information about which IO bit each memory cell belongs to, at the time a complex data pattern is to be written in memory cells.

A memory tester is used to test a memory. Such a memory tester generally has a scrambling function for converting logic addresses into physical addresses. However, memory testers having a scrambling function which takes into consideration IO bits in multibit memories are rarely available. Therefore, conventional multibit memories cannot be tested thoroughly insofar as an ordinary memory tester is used. It is not easy to generate a data pattern for use in a memory test, with IO bits taken into account.

SUMMARY OF THE INVENTION

It is therefore an object of the present invention to provide a multibit memory which can easily be tested using an ordinary memory tester and allows a memory test data pattern to be generated easily taking IO bits into account.

According to the present invention, the above object can be achieved by a multibit memory device comprising a memory cell array composed of mixed memory cells corresponding to different IO bits, a plurality of data input/output terminals corresponding respectively to IO bits, for inputting and outputting data in a parallel fashion to and from the memory cell array, the data input/output terminals being classified into a first data input/output terminal and a second data input/output terminal, an address terminal for inputting an address, internal data buses associated respectively with the IO bits and connected to the memory cell array, test mode entry signal generating means for generating a test mode entry signal indicative of entry into a test mode, pseudo-address generating means connected to the address terminal, for generating a pseudo-address in the test mode, and connecting means responsive to the test mode entry signal for selecting one of the internal data buses depending on the pseudo-address and connecting the selected one of the internal data buses to the first data input/output terminal in the test mode.

Since the multibit memory has pseudo-address generating means connected to the address terminal, for generating a pseudo-address in the test mode, and connecting means for selecting one of the internal data buses depending on the pseudo-address and connecting the selected one of the internal data buses to a certain input/output terminal, data can be written in and read from the memory cell which belongs to a selected IO-bit through the certain input/output terminal by inputting a signal through the address terminal in the test mode. The pseudo-address is an address signal for designating any one of the IO bits.

In the multibit memory, the number of bits of a row address signal is generally smaller than the number of bits of a column address signal. Therefore, when row and column addresses are supplied in a time sharing manner to address terminals, there is an address terminal which is used only for the row addresses in a normal operation mode. A pseudo-address signal may be generating by decoding a signal that is applied to the address terminal which is used only for the row addresses.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
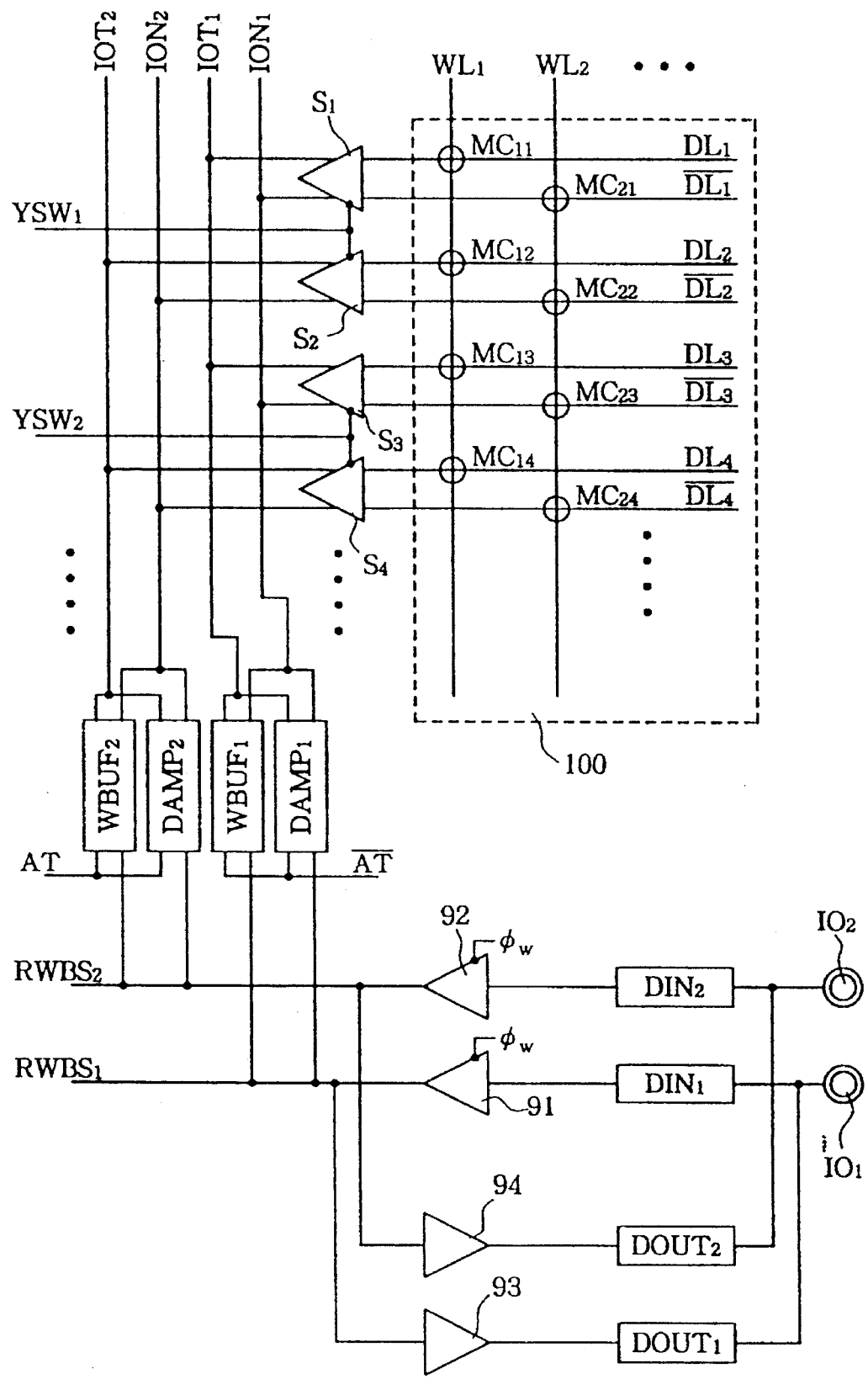
FIG. 1 is a schematic block diagram of a conventional multibit dynamic memory.
Figure 2:
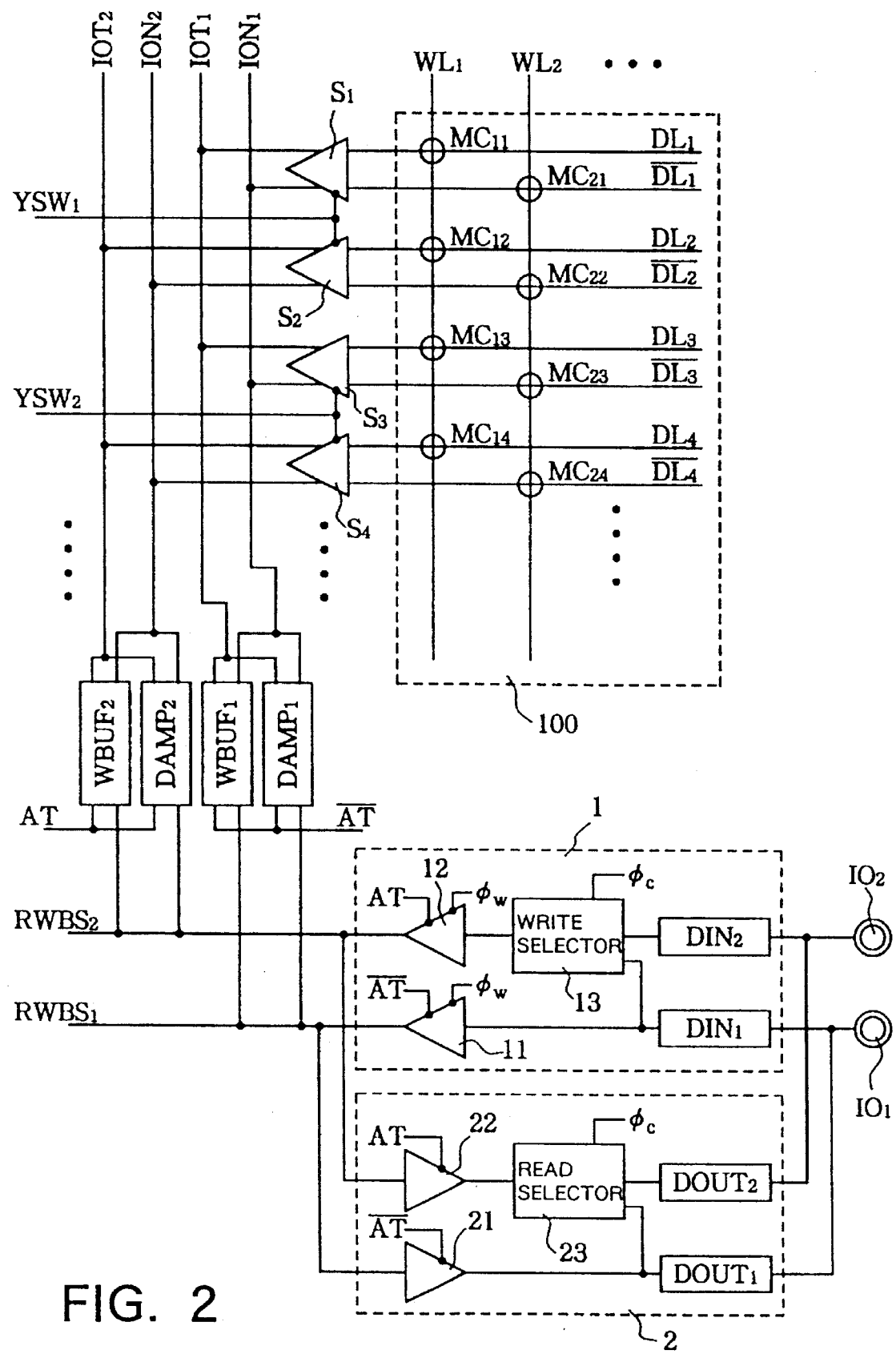
FIG. 2 is a schematic block diagram of a multibit memory according to a first embodiment of the present invention.

First Embodiment:

FIG. 2 shows in block form a multibit memory according to a first embodiment of the present invention, the view primarily illustrating an input/output circuit thereof. The multibit memory is in the form of a dynamic memory. The multibit memory differs from the conventional multibit memory shown in FIG. 1 in that it has a different buffer arrangement, a write selector 13 is provided between input buffers $DIN_1$, $DIN_2$ and a buffer 12, and a read selector 23 is provided between output buffers $DOUT_1$, $DOUT_2$ and a buffer 22. The multibit memory includes a pseudo-address signal generator 31 (see FIG. 3) for generating pseudo-address signals AT, $\overline{AT}$ to be given to the buffers 11, 12, 21, 22 and the selectors 13, 23, and a test mode entry signal generator (see FIG. 6) for generating a test mode entry signal $\phi_c$ indicative of a test mode. The pseudo-address signals AT, $\overline{AT}$ generated by the pseudo-address signal generator 31 are also supplied to the write data amplifiers $WBUF_1$, $WBUF_2$ and the read data amplifiers $DAMP_1$, $DAMP_2$. A circuit block composed of the input buffers $DIN_1$, $DIN_2$, the buffers 11, 12, and the write selector 13 is referred to as an input circuit section 1, and a circuit block composed of the output buffers $DOUT_1$, $DOUT_2$, the buffers 21, 22, and the read selector 23 is referred to as an output circuit section 2. Those blocks and parts shown in FIG. 2 which are denoted by identical reference characters in FIG. 1 are functional blocks and parts that are identical to those shown in FIG. 1.

Figure 3:
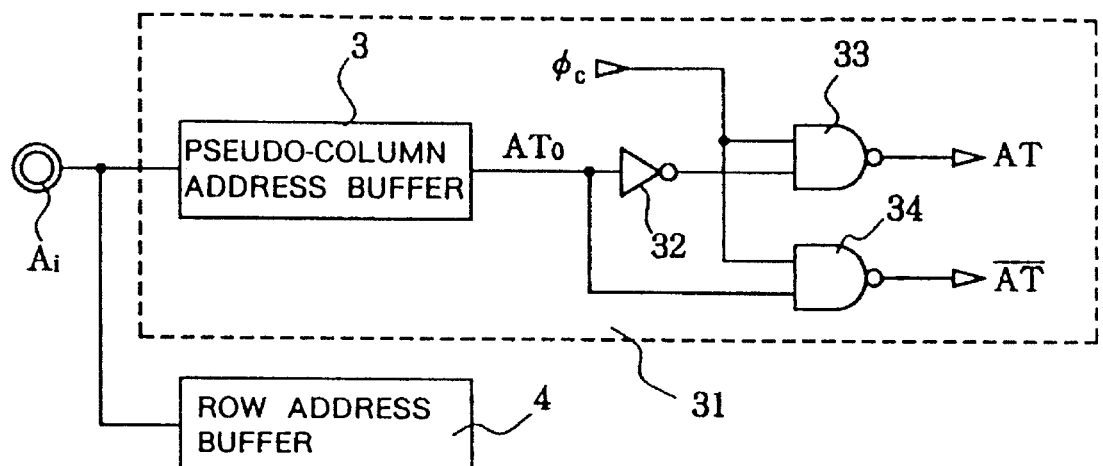
FIG. 3 is a block diagram of a pseudo-address signal generator.

The pseudo-address signal generator 31 will be described below with reference to FIG. 3. The pseudo-address signal generator 31 includes a pseudo-column address buffer 3, an inverter 32, and two two-input NAND gates 33, 34. Generally in a dynamic random access memory (DRAM), a column address and a row address are supplied in a time sharing fashion to its address signal terminal. As shown in FIG. 3, an address signal terminal $A_i$ is connected to a row address buffer 4 and the pseudo-column address buffer 3. The row address buffer 4 is of a structure which is the same as the row address buffer of the conventional memory. The pseudo-column address buffer 3 reads and latches an address signal in the same manner as the ordinary column address buffer. The test mode entry signal $\phi_c$ is supplied to one input terminal of each of the NAND gates 33, 34. The pseudo-column address buffer 3 supplies an output signal $AT_0$ directly to the other input terminal of the NAND gate 34, and through the inverter 32 to the other input terminal of the NAND gate 33. The NAND gate 33 outputs the pseudo-address signal AT, and the NAND gate 34 outputs the pseudo-address signal $\overline{AT}$.

The number of row address bits and the number of column address bits will be described below with respect to a 64-Mbit ($=2^{26}$ bits) DRAM. The 64-Mbit DRAM has 13 row address bits $X_0$ through $X_{12}$. Therefore, the 64-Mbit DRAM has row addresses 0 through 8191 in decimal representation. The number of row address bits in a general-purpose dynamic memory represents the number of refresh cycles required by the dynamic memory. Consequently, the 64-Mbit DRAM requires 8192 refresh cycles to be completed. Therefore, the depth of column addresses associated with one row address is 13 bits, i.e., 8191 addresses if 64 Mbits are composed of single IO bits.

If IO bits are not single bits, but are composed of plural bits, e.g., if the number of IO bits is 4, then the number of row address bits is 13, and the column addresses are divided into quarters each of 11 bits, i.e., addresses 0 through 2047. If the number of IO bits is 8, then the column addresses are divided into octuplicates each of 10 bits, i.e., addresses 0 through 1023. Generally, a multibit dynamic memory is arranged such that the number of column addresses is smaller than the number of row addresses. In a general multibit dynamic memory supplied with row and column address signals in a time sharing manner, an address input terminal of a low-order bit is connected to both row and column address buffers, whereas there is an address input terminal of a high-order bit which is connected only to the row address buffer depending on the number of IO bits. The address signal terminal $A_i$ shown in FIG. 3 is a high-order-bit address input terminal connected only to the row address buffer. In this embodiment, the pseudo-column address buffer 3 is connected to the address signal terminal $A_i$.

The input circuit section 1 will be described in detail with reference to FIG. 4. The write selector 13 is of a known structure comprising an inverter 41 and two transfer gates $TG_{11}$, $TG_{12}$, and is controlled by the test mode entry signal $\phi_c$. When the test mode entry signal $\phi_c$ is of a high level, i.e., logic level "1", an output signal from the input buffer $DIN_1$ is applied to the buffer 12 connected to the data bus $RWBS_2$. When the test mode entry signal $\phi_c$ is of a low level, i.e., logic level "0", an output signal from the other input buffer $DIN_2$ is applied to the buffer 12. Irrespective of whether the test mode entry signal $\phi_c$ is of a high level or a low level, an output signal from the input buffer $DIN_1$ is applied to the buffer 11 connected to the data bus $RWBS_1$.

The buffers 11, 12 are identical in structure to each other. Each of the buffers 11, 12 comprises a two-input NAND gate 42, an inverter 43, two p-channel MOS transistors 44, 45, and two n-channel MOS transistors 46, 47. The inverter 43 and the MOS transistors 44, 45, 46, 47 jointly make up a known 3-state buffer which is gate-controlled by an output signal from the NAND gate 42 such that the 3-state buffer is in a high-impedance state when the output signal from the NAND gate 42 is of a high level, i.e., logic level "1". The NAND gate 42 of the buffer 11 which is connected to the data bus $RWBS_1$ is supplied with a write operation signal $\phi_W$ and the pseudo-address signal $\overline{AT}$. The NAND gate 42 of the buffer 12 which is connected to the data bus $RWBS_2$ is supplied with the write operation signal $\phi_W$ and the pseudo-address signal AT.

Details of the output circuit section 2 will be described below with reference to FIG. 5. The read selector 23 is of a known structure comprising an inverter 51 and two transfer gates $TG_{21}$, $G_{22}$, and is controlled by the test mode entry signal $\phi_c$ as with the write selector 13. When the test mode entry signal $\phi_c$ is of a high level, an output signal from the buffer 22 connected to the data bus $RWBS_2$ is applied to the output buffer $DOUT_1$. When the test mode entry signal $\phi_c$ is of a low level, an output signal from the buffer 22 is applied to the output buffer $DOUT_2$. The buffer 21 connected to the data bus $RWBS_1$ and the output buffer $DOUT_1$ are connected to each other.

The buffers 21, 22 are identical in structure to each other. Each of the buffers 21, 22 comprises an inverter 52, two p-channel MOS transistors 53, 54, and two n-channel MOS transistors 55, 56, which jointly make up a known 3-state buffer. The buffer 21 connected to the data bus $RWBS_1$ is gate-controlled by the pseudo-address signal $\overline{AT}$ such that the buffer 21 is in a high-impedance state when the pseudo-address signal $\overline{AT}$ is of a low level. The buffer 22 connected to the data bus $RWBS_2$ is gate-controlled by the pseudo-address signal AT such that the buffer 22 is in a high-impedance state when the pseudo-address signal AT is of a low level.

Figure 6:
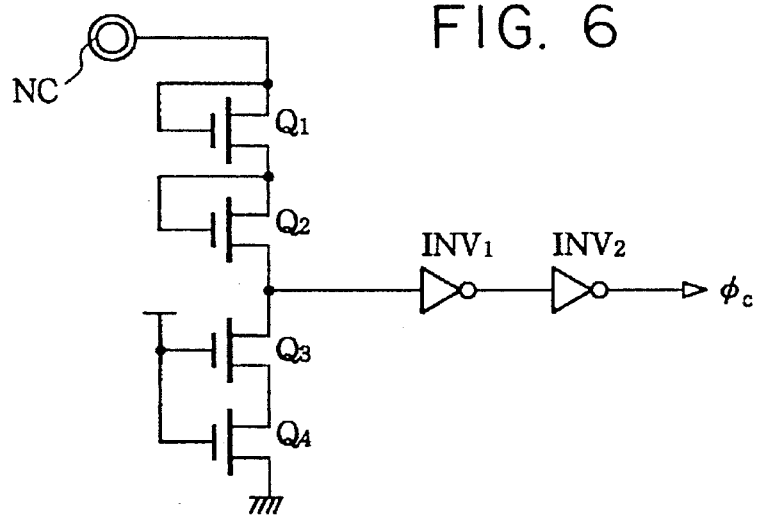
FIG. 6 is a circuit diagram of a test mode entry signal generator.

The test mode entry signal generator will be described in detail with reference to FIG. 6. The circuit shown in FIG. 6 is arranged to generate the test mode entry signal $\phi_c$ when a certain voltage is impressed on an unused input terminal NC. The unused input terminal NC is a terminal which is not used when the multibit memory is in normal use.

Generally, a dynamic memory may be entered into a test mode by applying a high voltage to a certain input terminal of the memory, or placing the memory in a write CBR mode, or inputting a certain key address under the write CBR mode. In this embodiment, the memory is entered into the test mode by applying a high voltage to the unused input terminal NC. However, the memory may be entered into the test mode by any of the other procedures as they do not limit the scope of the present invention.

As shown in FIG. 6, four n-channel MOS transistors $Q_1$ to $Q_4$ are inserted between the unused input terminal NC and ground such that their channels are connected in series with each other. Each of the MOS transistors $Q_1$, $Q_2$ closer to the unused input terminal NC has a drain and a gate which are connected to each other. Each of the MOS transistors $Q_3$, $Q_4$ closer to ground has a gate supplied with a power supply voltage. The MOS transistors $Q_2$, $Q_3$ are connected to each other through a node that is connected to the input terminal of an inverter $INV_1$, which has an output terminal connected to the input terminal of another inverter $INV_2$ that outputs the test mode entry signal $\phi_c$. When a voltage which is the sum of the threshold of the inverter $INV_1$ and the sum of the threshold voltages of the MOS transistors $Q_1$, $Q_2$ is applied to the unused input terminal NC, the test mode entry signal $\phi_c$ goes high in level, entering the multibit memory into the test mode.

Operation of the multibit memory will be described below. First, a normal operation mode of the multibit memory will be described below.

In the normal operation mode, since no voltage is applied to the unused input terminal NC (see FIG. 6), the test mode entry signal $\phi_c$ is of a low level. Therefore, the output signals from the NAND gates 33, 34 in the pseudo-address signal generator 31 are of a high level (logic level "1"), and the pseudo-address signals AT, $\overline{AT}$, are of a high level. In the input circuit section 1, the transfer gate $TG_{11}$ is disabled, and the transfer gate $TG_{12}$ is enabled. The output signal from the input buffer $DIN_1$ is inputted to the buffer 11, and the output signal from the other input buffer $DIN_2$ is inputted through the transfer gate $TG_{12}$ to the other buffer 12. Because both the pseudo-address signals AT, $\overline{AT}$ are of a high level, when the write operation signal $\phi_W$ goes high in level, the buffers 11, 12 are enabled and output data respectively to the data buses $RWBS_1$, $RWBS_2$. In the output circuit section 2, inasmuch as the buffers 21, 22 are enabled, the transfer gate $TG_{21}$ is disabled, and the transfer gate $TG_{22}$ is enabled, the data from the data bus $RWBS_1$ are outputted to the output buffer $DOUT_1$, and the data from the data bus $RWBS_2$ are outputted to the output buffer $DOUT_2$.

The write data amplifiers $WBUF_1$, $WBUF_2$ and the read data amplifiers $DAMP_1$, $DAMP_2$ associated with the memory cell array 100 are given the pseudo-address signals AT, $\overline{AT}$. Since both the pseudo-address signals AT, $\overline{AT}$ are of a high level, all the write data amplifiers $WBUF_1$, $WBUF_2$ and the read data amplifiers $DAMP_1$, $DAMP_2$ are enabled.

In the normal operation mode, therefore, because the test mode entry signal $\phi_c$ is of a low level, and both the pseudo-address signals AT, $\overline{AT}$ are of a high level, data are inputted and outputted through paths which are the same as those of the conventional multibit memory, and hence data are written and read in the same manner as the conventional multibit memory.

A process of writing and reading data when the multibit memory is entered into the test mode will be described below. When a high voltage is applied to the unused input terminal NC (see FIG. 6) to make the test mode entry signal $\phi_c$ high in level, one of the pseudo-address signals AT, $\overline{AT}$ is rendered high in level and the other low in level by the output signal $AT_0$ from the pseudo-column address buffer 3 in the pseudo-address signal generator 31. It is assumed here that the output signal $AT_0$ is of positive logic with respect to the logic level of the address signal terminal $A_i$, i.e., the output signal $AT_0$ is high in level when the address signal terminal $A_i$ is of a high level, and the output signal $AT_0$ is low in level when the address signal terminal $A_i$ is of a low level.

When the test mode entry signal $\phi_c$ goes high in level, the transfer gate $TG_{12}$ is disabled, and the transfer gate $TG_{11}$ is enabled in the input circuit section 1. Accordingly, both the buffers 11, 12 are supplied with the signal level given to the input/output signal terminal $IO_1$ through the input buffer $DIN_1$. When the write operation signal $\phi_W$ goes high in level at this time, since the pseudo-address signal AT is of a high level if the address signal terminal $A_i$ is high in level, the buffer 11 is disabled and the other buffer 12 is enabled. Thus, input data from the input/output signal terminal $IO_1$ are outputted to the data bus $RWBS_2$. On the other hand, if the address signal terminal $A_i$ is low in level, then since the pseudo-address signal $\overline{AT}$ is of a high level, the buffer 11 is enabled and the other buffer 12 is disabled. Input data from the input/output signal terminal $IO_1$ are outputted to the data bus $RWBS_1$.

The data thus outputted to the data buses $RWBS_1$, $RWBS_2$ are supplied through the write data amplifier $WBUF_1$ or $WBUF_2$ to the input/output data line pairs $IOT_1/ION_1$, $IOT_2/ION_2$, and written in memory cells through the sense amplifiers $S_1$ to $S_4$. Inasmuch as the write data amplifiers $WBUF_1$, $WBUF_2$ have been given the pseudo-address signal AT, $\overline{AT}$, respectively, when the pseudo-address signal AT is high in level, the data outputted to the data bus $RWBS_2$ are written in a memory cell belonging to the second IO bit (IO bit corresponding to the input/output signal terminal $IO_2$) through the write data amplifier $WBUF_2$. Likewise, when the pseudo-address signal $\overline{AT}$ is high in level, the data outputted to the data bus $RWBS_1$ are written in a memory cell belonging to the first IO bit (IO bit corresponding to the input/output signal terminal $IO_1$) through the write data amplifier $WBUF_1$ and the input/output data line pair $IOT_1/ION_1$.

Stored data are read as follows: When the pseudo-address signal AT is high in level, the data stored in the memory cell belonging to the second IO bit are outputted through the input/output data line pair $IOT_2/ION_2$ to the data bus $RWBS_2$ by the read data amplifier $DAMP_2$. When the pseudo-address signal $\overline{AT}$ is high in level, the data stored in the memory cell belonging to the first IO bit are outputted through the input/output data line pair $IOT_1/ION_1$ to the data bus $RWBS_1$ by the read data amplifier $DAMP_1$. In the output buffer circuit section 2, because the test mode entry signal $\phi_c$ is of a high level, the transfer gate $TG_{22}$ is disabled, and the transfer gate $TG_{21}$ is enabled, so that the output signals from the buffers 21, 22 are supplied to the output buffer $DOUT_1$. When the pseudo-address signal AT is high in level, the buffer 22 is enabled, and the data read from the memory cell belonging to the second IO bit are outputted through the output buffer $DOUT_2$ to the input/output signal terminal $IO_1$. When the pseudo-address signal $\overline{AT}$ is high in level, the buffer 21 is enabled, and the data read from the memory cell belonging to the first IO bit are outputted through the output buffer $DOUT_1$ to the input/output signal terminal $IO_1$.

In the test mode, as described above, data are inputted and outputted through only the input/output signal terminal $IO_1$.

If the logic level of the address signal terminal $A_i$ is low in level, then the data input/output path for the memory cell belonging to the first IO bit is enabled, and if logic level of the address signal terminal $A_i$ is high in level, then the data input/output path for the memory cell belonging to the second IO bit is enabled. Since the difference between IO bits is given as the difference between pseudo-addresses given to the address signal terminal $A_i$ in the test mode, the multibit memory can be tested taking IO bits into account by writing and reading data while controlling the logic level given to the address signal terminal $A_i$.

In this embodiment, when the multibit memory is entered into the test mode, the difference between IO bits can be handled as the difference between pseudo-addresses, making it possible to write data in and read data from the memory cell belonging to a certain IO bit by designating a pseudo-address.

A process of writing a data pattern of logic levels "0", "1", "1", "0" in adjacent memory cells on one word line will be described below.

The data pattern is such that data of logic level "0", logic level "1", logic level "1", and logic level "0" will be written respectively in the memory cells $MC_{11}, MC_{12}, MC_{13}, MC_{14}$. It has been difficult for the conventional multibit memory to be tested using such a data pattern.

In order to write logic level "0" in the memory cell $MC_{11}$, an address corresponding to the word line $WL_1$ is given to a row address signal, an address for selecting and activating the column switch signal $YSW_1$ is given to a column address signal, logic level "0" is given to the address signal terminal $A_i$ for a pseudo-column address, and logic level "0" is given to the input/output signal terminal $IO_1$. Then, the writing operation to the memory cell $MC_{11}$ is executed. Next, in order to write logic level "1" in the memory cell $MC_{12}$, an address for selecting and activating the column switch signal $YSW_1$ is given to a column address signal, logic level "1" is given to the address signal terminal $A_i$, and logic level "1" is given to the input/output signal terminal $IO_1$. Then the writing operation to the memory cell $MC_{12}$ is done. Similarly, data may be written in the memory cells $MC_{13}$, $MC_{14}$, taking into account only the logic and physical addresses of the memory cells. By adding a value for a pseudo-column address to the high-order position of column address bits for writing operation, it become possible to designate only the memory cell which belongs to a particular IO bit. Therefore, it becomes very easy to generate a test pattern for use in a memory test.

While the IO bits are 2 bits in the above embodiment, the principles of the present invention are applicable to a multibit memory having an increased number of IO bits by inputting pseudo-addresses through a plurality of address input terminals.

Second Embodiment:

A multibit memory according to a second embodiment of the present invention will be described below.

The multibit memory according to the present invention is a memory in which memory cells belonging to a plurality of IO bits are mixed in one memory cell array. As more and more IO bits are employed in a memory circuit, the need for mixing memory cells belonging to a plurality of IO bits in a memory cell array is increased. For example, if the number of entire IO bits is 8, then different memory cell arrays may be arranged to correspond to the respective IO bits. However, if the number of IO bits is 16, it may be necessary to mix memory cells belonging to a plurality of IO bits in one memory cell array.

In recent years, as the number of memory types has increased, it has been the general practice to construct, from one chip, different memory types of IO bit arrangement by changing wire bonding patterns or changing masks for making aluminum interconnections. For example, it is possible to fabricate memories having 8 IO bits and 16 IO bits from one chip by changing wire bonding patterns. Peripheral circuits for use with such memories should have a circuit arrangement necessary to cope with the 8 IO bits and 16 IO bits.

In the case where memories having different numbers of IO bits can be fabricated from one chip by changing wire bonding patterns or interconnections, the present invention can be carried out essentially without adding new circuits. A memory in the form of a 64-Mbit DRAM capable of switching between 8 IO bits and 16 IO bits will be described below. It is assumed that if the number of IO bits is 8, then no memory cells of different IO bits are mixed in one memory cell array, but if the number of IO bits is 16, then memory cells belonging to different two IO bits are mixed in one memory cell array.

In the 64-Mbit DRAM, as described above, if the number of IO bits is 8, then a column address input signal is of 10 bits, and if the number of IO bits is 16, then a column address input signal is of 9 bits. The 10th-bit column address input terminal is connected to a column address buffer in case the number of IO bits is 8. When the number of IO bits is 16, therefore, the column address buffer connected to the 10th-bit column address input terminal can be used as a pseudo-column address buffer, and no new pseudo-column address buffer is required to be added.

The memory according to the second embodiment will be compared with the memory according to the first embodiment shown in FIG. 2. A 10th-bit column address signal is used as pseudo-address signals AT, $\overline{AT}$, an input/output terminal at the time the number of IO bits is 8 is used as the input/output signal terminal $IO_1$, input/output terminals at the time the number of IO bits is 16 are used as the input/output signal terminals $IO_1$, $IO_2$, and switching between 8 IO bits and 16 IO bits is effected by the test mode entry signal $\phi_c$. With this configuration, the memory has all the necessary circuit arrangements. Specifically, when the memory is to operate as a memory in which the number of IO bits is 8, the test mode entry signal $\phi_c$ is rendered high in level, and when the memory is to operate as a memory in which the number of IO bits is 16, the test mode entry signal $\phi_c$ is rendered low in level. According to this embodiment, when the memory in which the number of IO bits is 16 is tested, the memory is operated internally as a memory in which the number of IO bits is 8.

Figure 7:
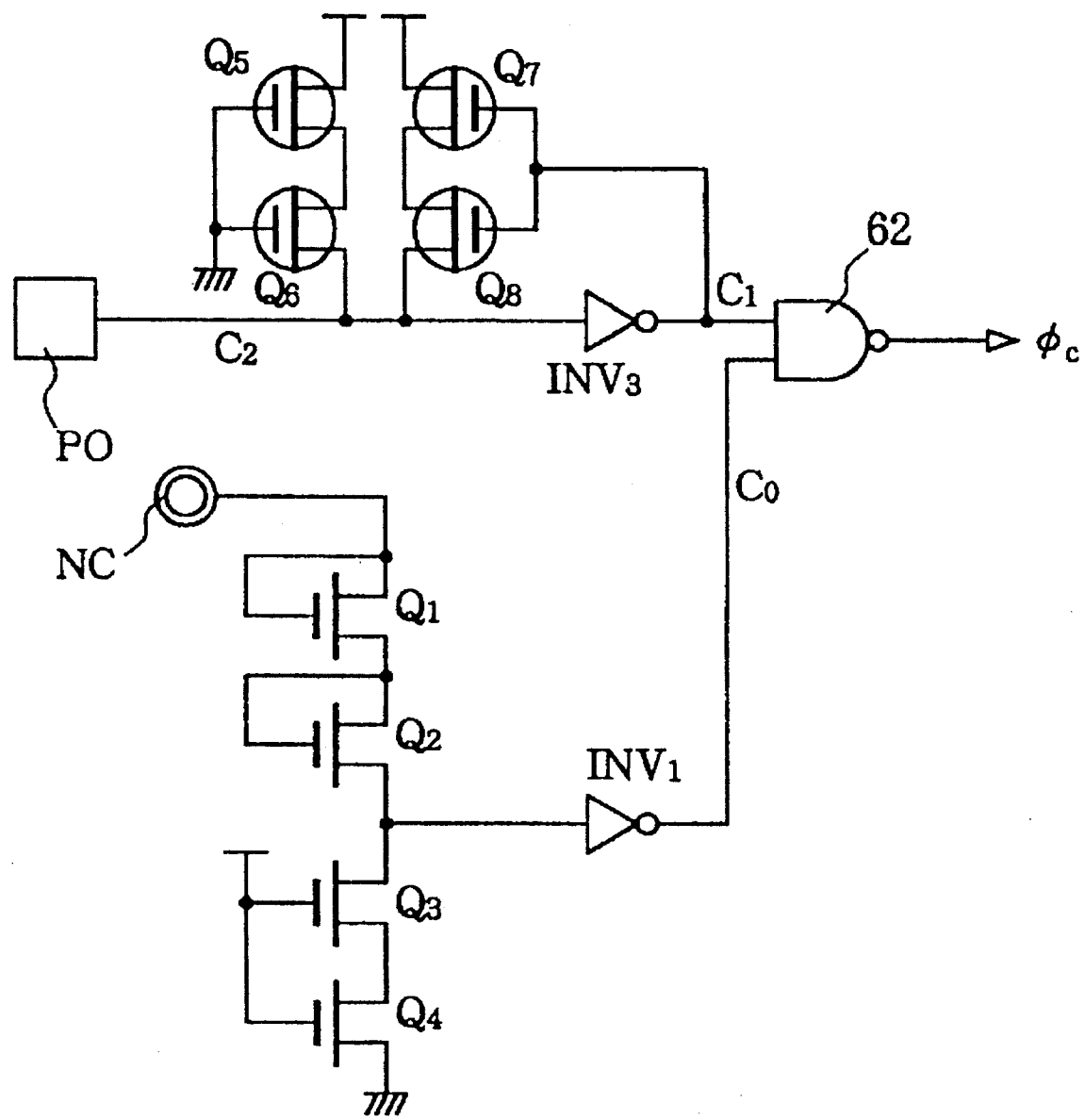
FIG. 7 is a circuit diagram of a test mode entry signal generator in a multibit memory according to a second embodiment of the present invention.

FIG. 7 shows a test mode entry signal generator in the multibit memory according to the second embodiment. The test mode entry signal generator shown in FIG. 7 differs from the test mode entry signal generator according to the first embodiment shown in FIG. 6 in that the inverter $INV_2$ shown in FIG. 6 is replaced with a two-input NAND gate 62, and an inverter $INV_3$ and four p-channel MOS transistors $Q_5$ to $Q_8$ are added. The inverter $INV_3$ has an input terminal connected to a bonding pad PO, and the NAND gate 62 has input terminals supplied with output signals from the inverters $INV_1$, $INV_3$. The MOS transistors $Q_5$, $Q_6$ are connected in series between a power supply and the input terminal of the inverter $INV_3$, and have gates grounded. The MOS transistors $Q_7$, $Q_8$ are also connected in series between the power supply and the input terminal of the inverter $INV_3$, and have gates connected to the output terminal of the inverter $INV_3$. The NAND gate 62 outputs a test mode entry signal $\phi_c$. The inverter $INV_1$ produces an output signal $C_0$, the inverter $INV_3$ produces an output signal $C_1$, and the inverter $INV_3$ is supplied with an input signal $C_2$ from the bonding pad BO.

When nothing is bonded to the bonding pad BO, since the input signal $C_2$ is of a high level, the output signal $C_1$ is low in level, and the test mode entry signal $\phi_c$ is high in level. The multibit memory now serves as a memory in which the number of IO bits is 8. If the bonding pad BO is bonded to ground, then since the output signal $C_1$ is high in level, the test mode entry signal $\phi_c$ is low in level if the output signal $C_0$ is high in level. The multibit memory now serves as a memory in which the number of IO bits is 16. When a high voltage is applied to the unused input terminal NC, the output signal $C_0$ goes low in level, and the test mode entry signal $\phi_c$ goes high in level even if the bonding pad BO is bonded to ground, so that the multibit memory now serves as a memory in which the number of IO bits is 8.

Therefore, if the multibit memory is arranged to operate as a memory in which the number of IO bits is 16 in a normal operation mode, by connecting the bonding pad BO to ground, then when a high voltage is applied to the unused input terminal NC to enter the memory into a test mode, the test mode entry signal $\phi_c$ goes high in level. In the test mode, the multibit memory now operates as a memory in which the number of IO bits is 8. Therefore, those memory cells which are disposed in one memory cell array and belong to different IO bits $IO_1$, $IO_2$ in the normal operation mode become memory cells having different 10th-bit column addresses in the test mode. Data are written in and read from these memory cells through the input/output signal terminal $IO_1$ at the time the number of IO bits is 8.

Figure 4:
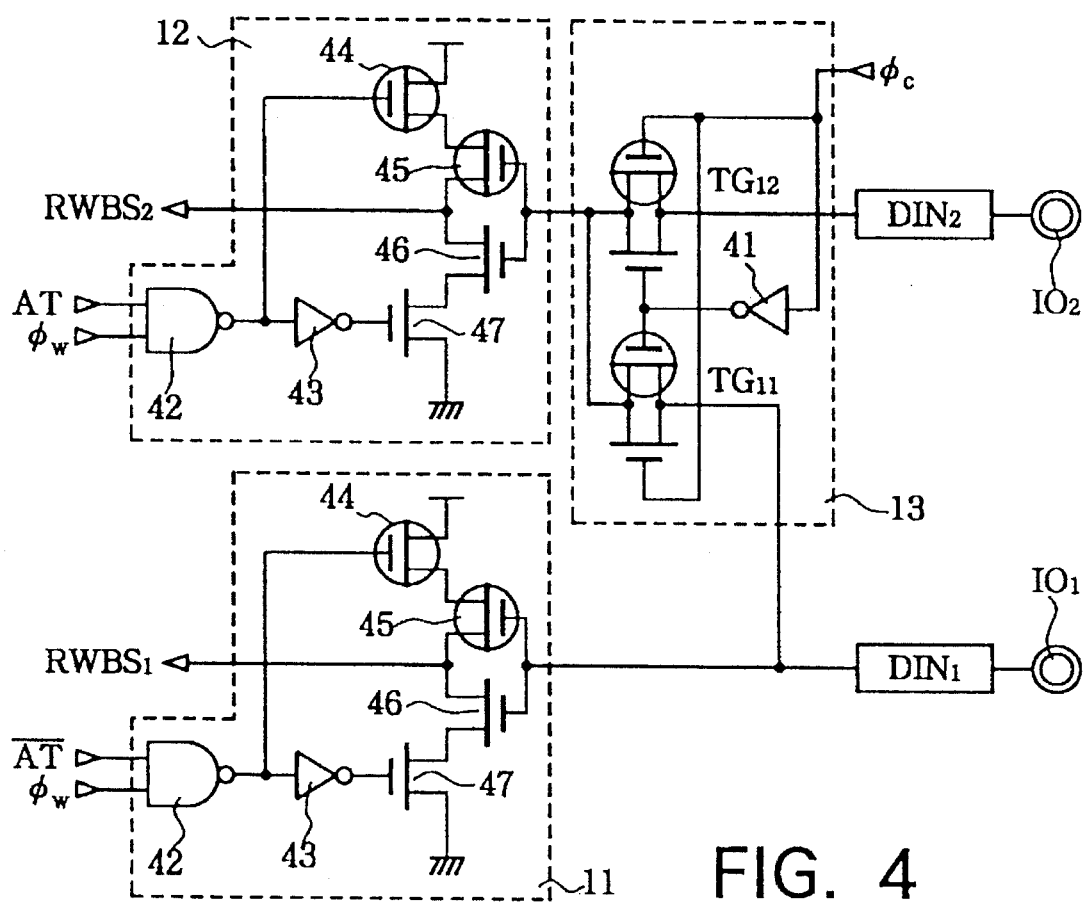
FIG. 4 is a circuit diagram of an input circuit section.
Figure 5:
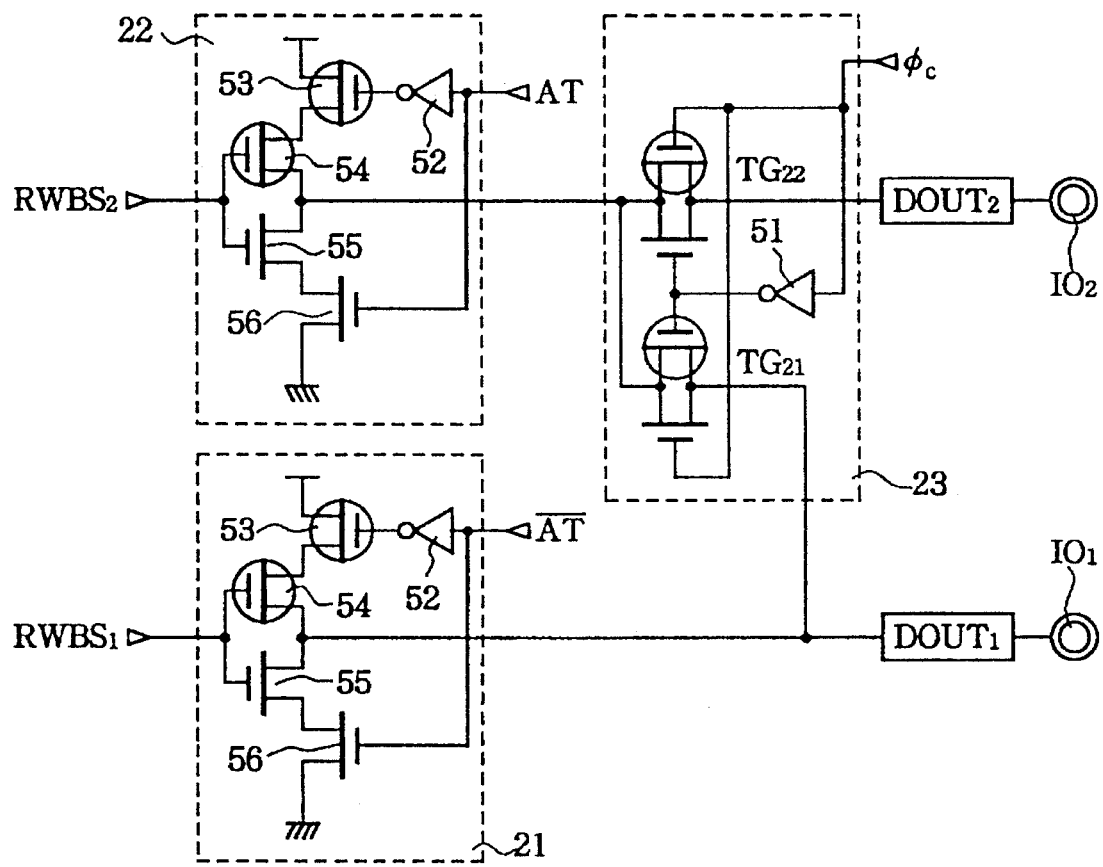
FIG. 5 is a circuit diagram of an output circuit section.

The present invention is not limited to the specific circuit arrangements shown in FIGS. 3 through 5, but any desired circuit arrangements may be employed insofar as they can write and read data while replacing the difference between IO bits as the difference between pseudo-addresses.

Although certain preferred embodiments of the present invention has been shown and described in detail, it should be understood that various changes and modifications may be made therein without departing from the scope of the appended claims.

What is claimed is:

1. A multibit memory device comprising:

a memory cell array composed of mixed memory cells corresponding to different IO bits;

a plurality of data input/output terminals corresponding respectively to IO bits, for inputting and outputting data in a parallel fashion to and from said memory cell array, said data input/output terminals being classified into a first data input/output terminal and a second data input/output terminal;

an address terminal for inputting an address;

internal data buses associated respectively with the IO bits and connected to said memory cell array;

test mode entry signal generating means for generating a test mode entry signal indicative of entry into a test mode;

pseudo-address generating means connected to said address terminal, for generating a pseudo-address in said test mode; and connecting means responsive to said test mode entry signal for selecting one of said internal data buses depending on said pseudo-address and connecting the selected one of the internal data buses to said first data input/output terminal in said test mode.

2. The multibit memory device according to claim 1, wherein said connecting means comprises buffers connected respectively to said internal data buses and selectively operable in response to said pseudo-address, and a transfer gate circuit associated with said second data input/output terminal for disconnecting said second data input/output terminal and connecting a corresponding one of said buffers to said first data input/output terminal in response to said test mode entry signal.

3. The multibit memory device according to claim 1, wherein:
said connecting means connects said data input/output terminals respectively to said internal data buses in a normal operation mode which is distinct from said test mode.

4. The multibit memory device according to claim 2, wherein:
said connecting means connects said buffers respectively to said data input/output terminals in a normal operation mode which is distinct from said test mode.

5. The multibit memory device according to claim 1, wherein said test mode entry signal generating means comprises a terminal which is unused in a normal operation mode, and a circuit for generating said test mode entry signal when a voltage higher than a predetermined threshold voltage is applied to said terminal.

6. The multibit memory device according to claim 1, comprising a plurality of address terminals, said pseudo-address generating means being connected to a predetermined one of said address terminals.

7. The multibit memory device according to claim 6, wherein column and row addresses are supplied in a time sharing manner to the multibit memory device, said pseudo-address generating means is connected to one or more than one of said address terminals which are used by row addresses but not by column addresses, and decodes a signal supplied to said one or more than one of the address terminals to generate the pseudo-address.

* * * * *